United States Patent
Thirunavukarasu et al.

(10) Patent No.: US 11,721,583 B2
(45) Date of Patent: Aug. 8, 2023

(54) MAINFRAME-LESS WAFER TRANSFER PLATFORM WITH LINEAR TRANSFER SYSTEM FOR WAFER PROCESSING MODULES

(71) Applicant: Applied Materials, Inc., Santa Clara, CA (US)

(72) Inventors: Sriskantharajah Thirunavukarasu, Singapore (SG); Karthik Balakrishnan, Singapore (SG); Karthik Elumalai, Singapore (SG); Eng Sheng Peh, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 398 days.

(21) Appl. No.: 16/989,746

(22) Filed: Aug. 10, 2020

(65) Prior Publication Data
US 2022/0044968 A1    Feb. 10, 2022

(51) Int. Cl.
*H01L 21/78*    (2006.01)
*H01L 21/673*    (2006.01)
(Continued)

(52) U.S. Cl.
CPC ............ *H01L 21/78* (2013.01); *B23K 26/364* (2015.10); *H01L 21/673* (2013.01);
(Continued)

(58) Field of Classification Search
CPC . H01L 21/78; H01L 21/673; H01L 21/67739; H01L 23/544; H01L 2223/5446;
(Continued)

(56) References Cited

U.S. PATENT DOCUMENTS

| 5,404,894 A * | 4/1995 | Shiraiwa | H01L 21/67745 414/217 |
| 2004/0043513 A1* | 3/2004 | Ishizawa | B65G 49/067 438/1 |

(Continued)

FOREIGN PATENT DOCUMENTS

| CN | 1696030 | 11/2005 |
| JP | 2002-151568 | 5/2002 |

OTHER PUBLICATIONS

International Search Report and Written Opinion from Application No. PCT/US2021/041473 dated Nov. 2, 2021, 10 pgs.
(Continued)

*Primary Examiner* — John P. Dulka
(74) *Attorney, Agent, or Firm* — Schwabe, Williamson & Wyatt, P.C.

(57) ABSTRACT

In an embodiment, a semiconductor processing tool for implementing hybrid laser and plasma dicing of a substrate is provided. The semiconductor processing tool comprises a transfer module, where the transfer module comprises a track robot for handling the substrate, and a loadlock attached to the transfer module. In an embodiment, the loadlock comprises a linear transfer system for handling the substrate. In an embodiment, the processing tool further comprises a processing chamber attached to the loadlock, wherein the linear transfer system of the loadlock is configured to insert and remove the substrate from the processing chamber.

15 Claims, 9 Drawing Sheets

(51) Int. Cl.
*H01L 21/677* (2006.01)
*B23K 26/364* (2014.01)
*H01L 23/544* (2006.01)
*B23K 101/40* (2006.01)

(52) U.S. Cl.
CPC ...... *H01L 21/67739* (2013.01); *H01L 23/544* (2013.01); *B23K 2101/40* (2018.08); *H01L 2223/5446* (2013.01)

(58) Field of Classification Search
CPC ........ H01L 21/67092; H01L 21/67201; B23K 26/364; B23K 2101/40; B23K 26/0624; B23K 2103/172; B23K 26/0093; B23K 26/0661; B23K 26/402; B23K 26/0838
See application file for complete search history.

(56) References Cited

U.S. PATENT DOCUMENTS

| | | | |
|---|---|---|---|
| 2010/0173439 A1 | 7/2010 | Lei et al. | |
| 2016/0086852 A1* | 3/2016 | Holden | H01J 37/32366 |
| | | | 438/462 |
| 2016/0163572 A1 | 6/2016 | Mooring | |

OTHER PUBLICATIONS

International Preliminary Report on Patentability from PCT/US2021/041473 dated Feb. 23, 2023, 7 pgs.

\* cited by examiner

MAINFRAME-LESS WAFER TRANSFER PLATFORM WITH LINEAR TRANSFER SYSTEM FOR WAFER PROCESSING MODULES

BACKGROUND

1) Field

Embodiments of the present disclosure pertain to the field of semiconductor processing and, in particular, to processing tools for dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present disclosure include methods of, and apparatuses for, dicing semiconductor wafers.

In an embodiment, a semiconductor processing tool for implementing hybrid laser and plasma dicing of a substrate is provided. The semiconductor processing tool comprises a transfer module, where the transfer module comprises a track robot for handling the substrate, and a loadlock attached to the transfer module. In an embodiment, the loadlock comprises a linear transfer system for handling the substrate. In an embodiment, the processing tool further comprises a processing chamber attached to the loadlock, wherein the linear transfer system of the loadlock is configured to insert and remove the substrate from the processing chamber.

In an embodiment, a loadlock in a processing tool for implementing hybrid laser and plasma dicing of a substrate is provided. In an embodiment, the loadlock comprises an enclosure, where a first door is on a first side of the enclosure and a second door is on a second side of the enclosure that is opposite from the first side, and a linear actuator in the enclosure, where the linear actuator extends out the second door when extended. In an embodiment, the loadlock further comprises an end effector attached to the linear actuator.

In an embodiment, a plasma laser dicing tool for dicing of a substrate is provided. In an embodiment, the plasma laser dicing tool comprises a transfer module, where the transfer module comprises a track robot for handling the substrate, and a laser module attached to the transfer module, where the track robot is configured to insert and remove the substrate from the laser module. In an embodiment, the plasma laser dicing tool further comprises a first loadlock attached to the transfer module, where the first loadlock comprises a first linear transfer system for handling the substrate, and a first processing chamber attached to the first loadlock, where the first linear transfer system of the first loadlock is configured to insert and remove the substrate from the first processing chamber. In an embodiment, the plasma laser dicing tool further comprises a second loadlock attached to the transfer module, where the second loadlock comprises a second linear transfer system for handling the substrate, and a second processing chamber attached to the second loadlock, where the second linear transfer system of the second loadlock is configured to insert and remove the substrate from the second processing chamber.

DETAILED DESCRIPTION

Methods of dicing semiconductor wafers, each wafer having a plurality of integrated circuits thereon, are described. In the following description, numerous specific details are set forth of processing tools for implementing the dicing methods, such as, linear transfer loadlocks in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. More specifically, one or more embodiments are directed to processing tools without a wafer handling mainframe for implementing the hybrid wafer or substrate dicing process.

In an embodiment, the processing tool comprises linear transfer loadlocks. The linear transfer loadlocks allow for substrates or wafers to be transferred from a universal linear transfer module (ULTM) directly into the processing chambers without needing to pass through a mainframe module. To provide context, traditional loadlocks do not include features for transporting the substrates or wafers. That is, a factory interface (FI) inserts the substrate or wafer into the loadlock, and a robot in the mainframe removes the substrate or wafer from the loadlock after a desired pressure is obtained within the loadlock. Since the linear transfer loadlocks described herein include features for transporting the substrate or wafer, the mainframe can be omitted.

Advantages to implementing one or more embodiments described herein may include one or more of: (1) decreased cost of the processing tool, (2) smaller footprint of the processing tool, (3) increased configurability of the processing tool, and/or (4) decreased lead time needed for installation of the processing tool.

Figure 1:
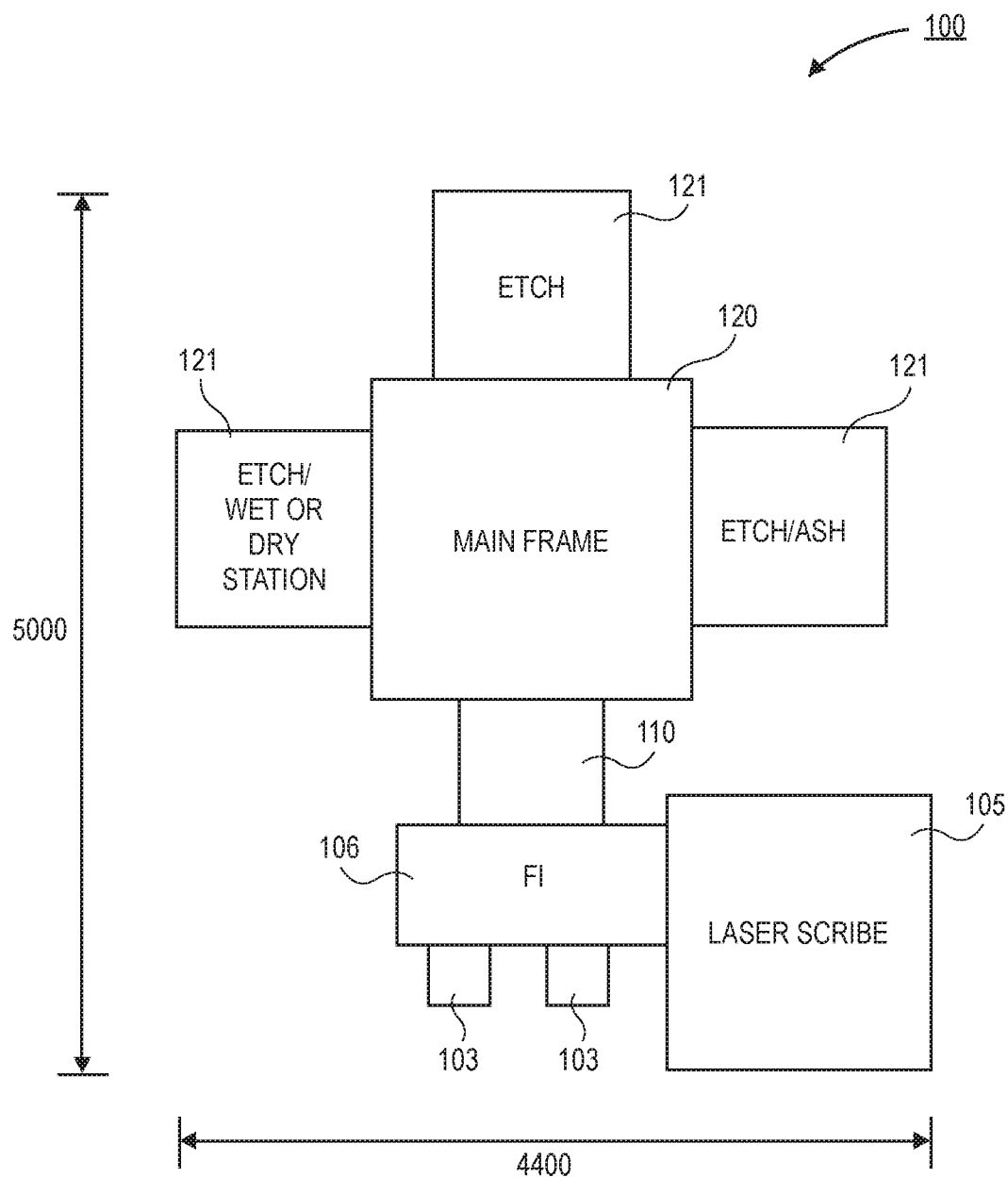
FIG. 1 is a block diagram of a tool layout for laser and plasma dicing of wafers or substrates that includes a wafer handling mainframe, in accordance with an embodiment of the present disclosure.

To provide context, FIG. 1 illustrates a block diagram of a processing tool 100 for laser and plasma dicing of substrates that includes a mainframe 120. The mainframe 120 may be a central unit with a multi-axis wafer handling robot that is used to distribute substrates or wafers to various processing chambers 121 of the tool 100. The processing chambers 121 may include plasma etching chambers and/or other suitable chambers for implementing the hybrid wafer dicing processes. For example, processing chambers 121 may also include wet/dry stations, ashing stations, and/or deposition chambers.

As shown, substrate or wafer storage units 103 (e.g., front opening unified pods (FOUPs) or cassettes) are attached to a FI 106. The FI 106 is coupled to the wafer handling mainframe 120 by a loadlock 110. The FI 106 is typically at atmospheric pressure, and the mainframe 120 is at a subatmospheric pressure (e.g., a vacuum pressure). The loadlock 110 provides a path through the tool 100 for transporting the substrates or wafers from the atmospheric pressure of the FI 106 to the vacuum pressure of the mainframe 120. Additionally, since the mainframe provides routing to the various processing chambers 121, a single loadlock 110 is needed. That is, there may be more processing chambers 121 than there are loadlocks 110. As noted above, the loadlock 110 typically does not include features for transporting substrates or wafers. Substrates or wafers are inserted and/or removed from the loadlock 110 by robots of the mainframe 120 and the FI 106. A laser scribe module 105 may be coupled to the FI 106 as well. The laser scribe module 105 may be at an atmospheric pressure and does not require a loadlock 110.

The inclusion of the mainframe 120 for distributing wafers or substrates has several drawbacks. First, the cost of the mainframe 120 is high. This is because the mainframe needs to include a multi-axis wafer handling robot, and pressure regulation is needed to maintain the needed vacuum level. The complexity of the mainframe also leads to long lead times needed for installation of the tool 100. Additionally, the mainframe significantly increases the footprint of the tool 100. For example, a length dimension of the tool 100 may be approximately 4,400 millimeters (4.4. meters), and a depth dimension of the tool 100 may be approximately 5,000 millimeters (5.0 meters). Excessively large footprints are not desirable due to the high cost of real estate in semiconductor fabrication facilities (also referred to as "fabs").

Accordingly, embodiments disclosed herein include a processing tool that has a mainframe-less architecture. Particularly, the mainframe is eliminated, and the substrates or wafers are distributed to/from the processing chambers directly from the loadlocks. Embodiments disclosed herein include linear transfer loadlocks in order to insert or retrieve substrates or wafers from the processing chambers. The linear transfer loadlocks include a linear actuator for transporting the substrates or wafers. A linear actuator is much less complex than the multi-axis robot of the mainframe, and is therefore less expensive. The elimination of the mainframe also results in a more compact footprint.

Figure 2A:
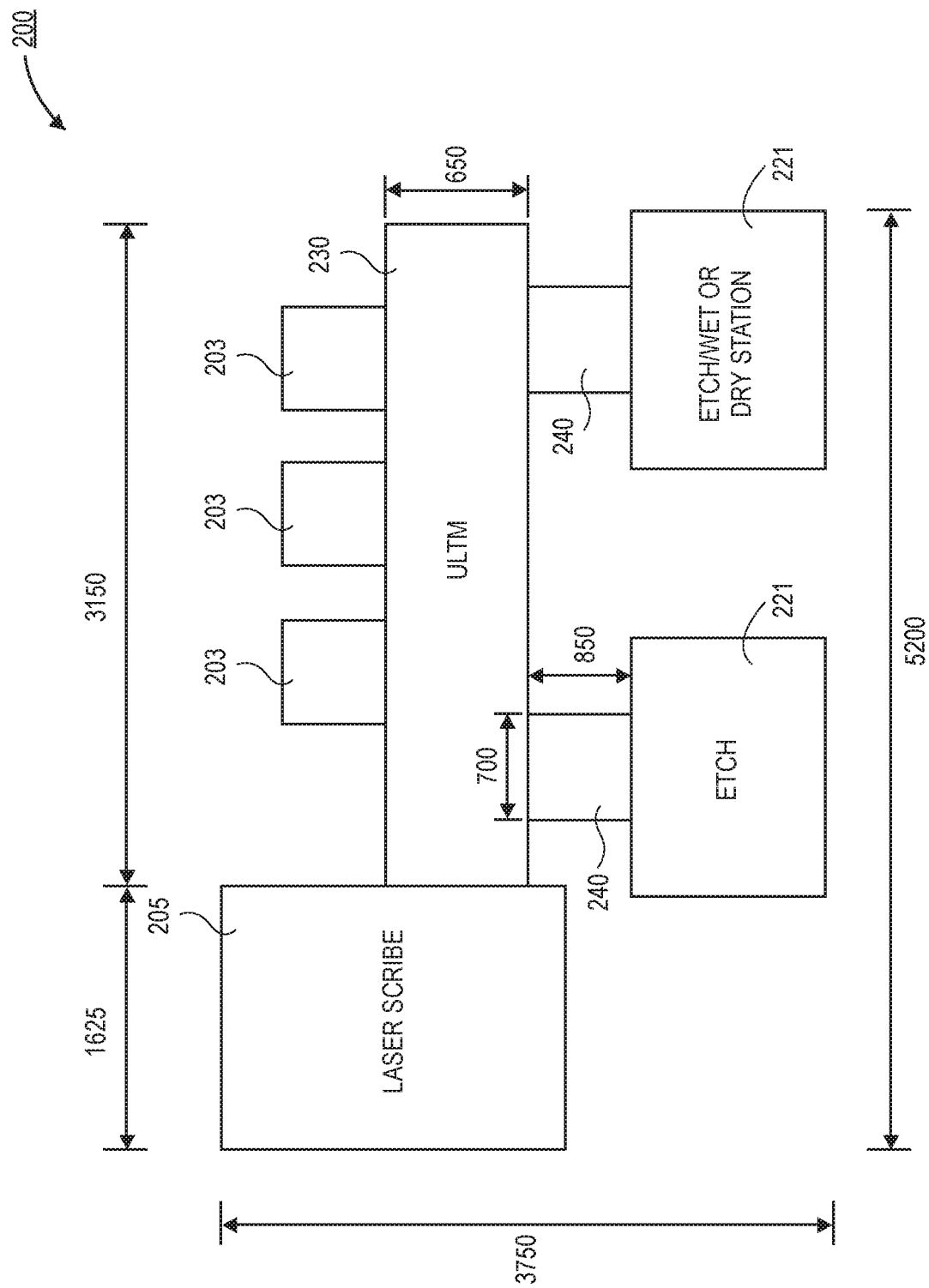
FIG. 2A is a block diagram of a tool layout for laser and plasma dicing of wafers or substrates that includes linear transfer loadlocks, in accordance with an embodiment of the present disclosure.

Referring now to FIG. 2A, a block diagram of a processing tool 200 with linear transfer loadlocks 240 is shown, in accordance with an embodiment. In an embodiment, the tool 200 comprises a universal linear transfer module (ULTM) 230. The ULTM 230 may be a suitable atmospheric port to interface between an outside manufacturing facility with laser scribe module 205 and the linear transfer loadlocks 240. The ULTM 230 may include robots with arms or blades for transferring wafers (or carriers thereof) from storage units 203 (such as FOUPs or cassettes) into either linear transfer loadlocks 240 or laser scribe module 205, or both.

In an embodiment, one or more processing chambers 221 may be coupled to the ULTM 230 by the linear transfer loadlocks 240. The linear transfer loadlocks 240 may have an actuation mechanism to insert and retrieve substrates or wafers from the processing chambers 221. A more detailed description of the linear transfer loadlocks 240 is provided below.

In an embodiment, the one or more processing chambers 221 are configured for etching a wafer or substrate through the gaps in a patterned mask to singulate a plurality of integrated circuits. In one such embodiment, the one or more processing chambers 221 is configured to perform a deep silicon etch process. In a specific embodiment, the one or more processing chambers 221 is an Applied Centura® Silvia™ Etch system, available from Applied Materials of Sunnyvale, Calif., USA. The etch chamber may be specifically designed for a deep silicon etch used to singulate integrated circuits housed on or in single crystalline silicon substrates or wafers. In an embodiment, a high-density plasma source is included in the processing chamber 221 to facilitate high silicon etch rates. In an embodiment, more than one etch chamber is included in the tool 200 to enable high manufacturing throughput of the singulation or dicing process.

Processing tool 200 may include other processing chambers 221 suitable for performing functions in a method of singulation. For example, in one embodiment, in place of an additional etch chamber, a deposition chamber is included. The deposition chamber may be configured for mask deposition on or above a device layer of a wafer or substrate prior to laser scribing of the wafer or substrate. In one such embodiment, the deposition chamber is suitable for depositing a photo-resist layer. In another embodiment, in place of an additional etch chamber, a wet/dry station is included. The wet/dry station may be suitable for cleaning residues and fragments, or for removing a mask, subsequent to a laser scribe and plasma etch singulation process of a substrate or wafer. In yet another embodiment, in place of an additional deep silicon etch chamber, a plasma etch chamber is included and is configured for performing a plasma-based cleaning process. In an embodiment, a metrology station is also included as a component of process tool 200.

In the illustrated embodiment, the processing chambers 221 are provided along a single side of the ULTM 230 opposite from the storage units 203, and the laser scribe module 205 is provided along an end of the ULTM 230. However, embodiments are not limited to such a configurations. As will be described in greater detail below, the ULTM 230 may further include a port along an end of the ULTM 230 opposite from the laser scribe module 205 to provide a connection to another processing chamber 221.

In an embodiment, the number of linear transfer loadlocks 240 is equal to the number of processing chambers 221. That is, each processing chamber 221 is connected to the ULTM 230 by a different linear transfer loadlock 240. This is different than existing configurations that utilize a mainframe, where the number of processing chambers 221 are not necessarily the same as the number of loadlocks.

In an embodiment, the laser scribe module 205 houses a laser assembly configured to provide a laser beam. In an embodiment, the laser assembly includes a Gaussian source laser beam. In an embodiment, the laser assembly includes a femtosecond source laser beam. In an embodiment, the laser is suitable for performing a laser ablation portion of a hybrid laser and etch singulation process, such as the laser ablation processes described below. In one embodiment, a moveable stage is also included in laser scribe module 205, the moveable stage configured for moving a wafer or substrate (or a carrier thereof) relative to the laser. In a specific embodiment, the laser is also moveable.

The elimination of the mainframe allows for a reduced footprint of the tool 200. In an embodiment, a length dimension of the tool 200 may be approximately 5,200 millimeters (5.2 meters), and a depth dimension of the tool 200 may be approximately 3,750 millimeters (3.75 meters). The ULTM may have dimensions of approximately 650 millimeters (0.65 meters) by approximately 3,150 millimeters (3.15 meters). The linear transfer loadlocks 240 may have dimensions of approximately 850 millimeters (0.85 meters) by approximately 700 millimeters (0.7 meters). While specific dimensions are provided, it is to be appreciate that the dimensions of various components of the tool 200 may be modulated in order to provide a desired configuration and/or to provide more (or fewer) processing chambers 221. As such, the configurability of the tool 200 is extremely flexible to provide a tool for given set of manufacturing requirements.

Figure 2B:
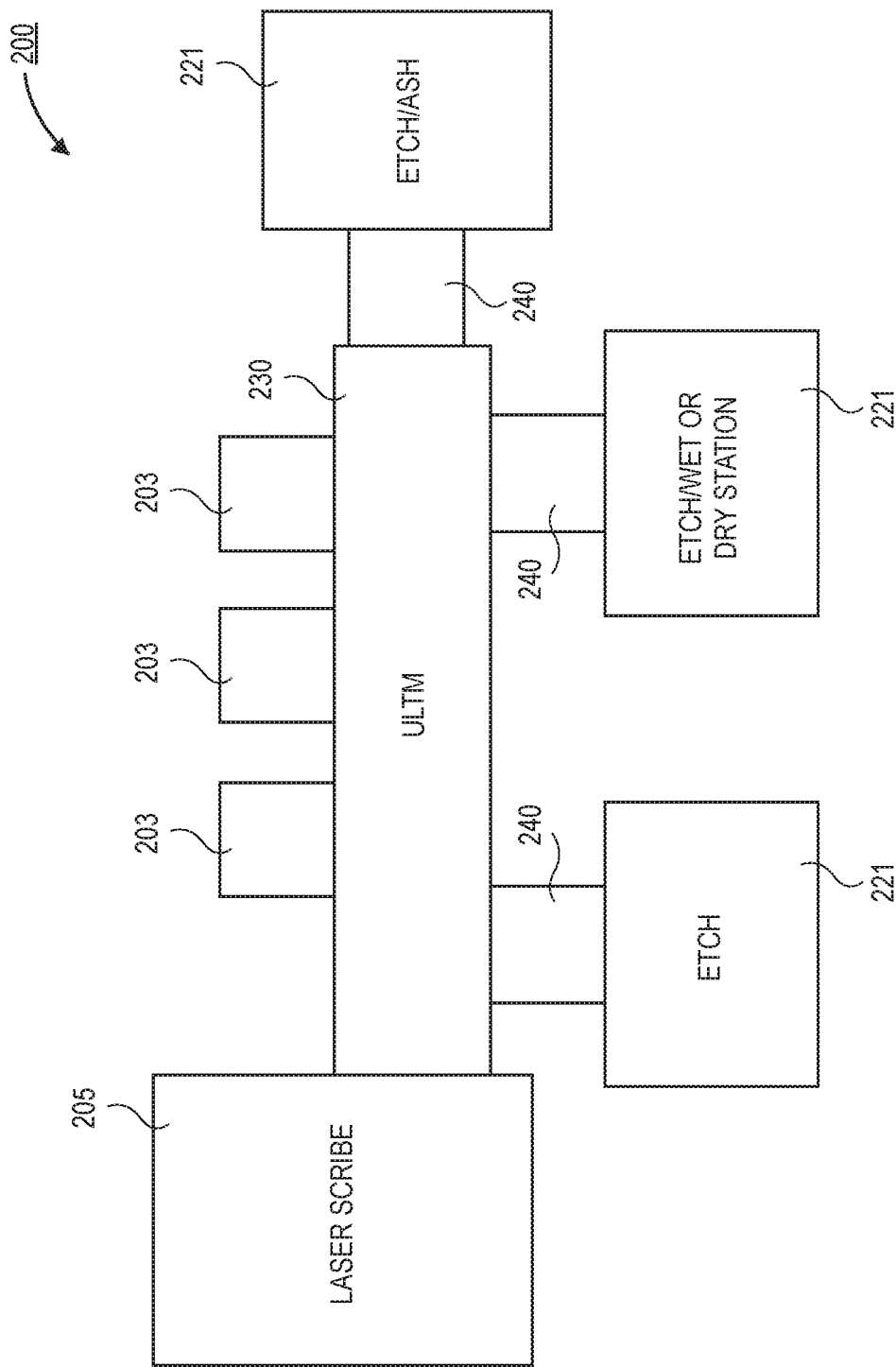
FIG. 2B is a block diagram of a tool layout for laser and plasma dicing of wafers or substrates that includes linear transfer loadlocks and processing chambers along more than one edge of the universal linear transfer module (ULTM), in accordance with an embodiment of the present disclosure.

Referring now to FIG. 2B, a block diagram of a processing tool 200 for hybrid dicing is shown, in accordance with an additional embodiment of the present disclosure. As shown, the processing tool 200 in FIG. 2B is substantially similar to the processing tool 200 in FIG. 2A, with the exception that an additional processing chamber 221 is provided along an end of the ULTM 230. The additional processing chamber 221 may be connected to the ULTM 230 by an additional linear transfer loadlock 240. As shown, the processing chambers 221 are not limited to being positioned adjacent to a single side of the ULTM 230. As such, additional configuration flexibility is provided.

Figure 2C:
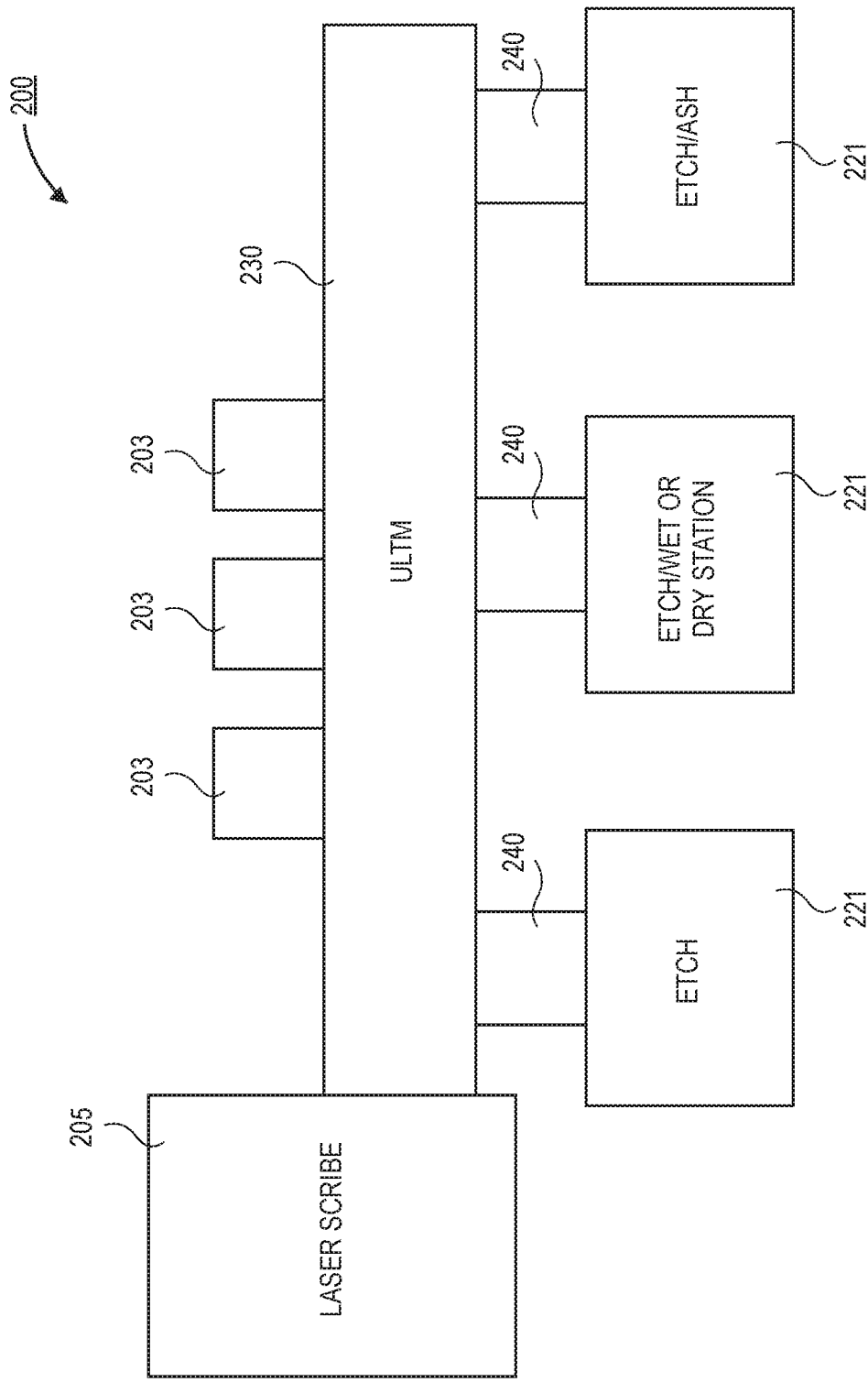
FIG. 2C is a block diagram of a tool layout for laser and plasma dicing of wafers or substrates that includes an extended ULTM to accommodate additional processing chambers, in accordance with an embodiment of the present disclosure.

Referring now to FIG. 2C, a block diagram of a processing tool 200 for hybrid dicing is shown, in accordance with an additional embodiment of the present disclosure. As shown, the processing tool 200 in FIG. 2C may be substantially similar to the processing tool 200 in FIG. 2A, with the exception that the ULTM 230 is extended (in the length dimension) to accommodate additional processing chambers 221. The additional processing chamber 221 is coupled to the ULTM 230 by an additional linear transfer loadlock 240. While three processing chambers 221 are shown, it is to be appreciated that embodiments may include any number of processing chambers 221 by extending the length of the ULTM 230.

Figure 3:
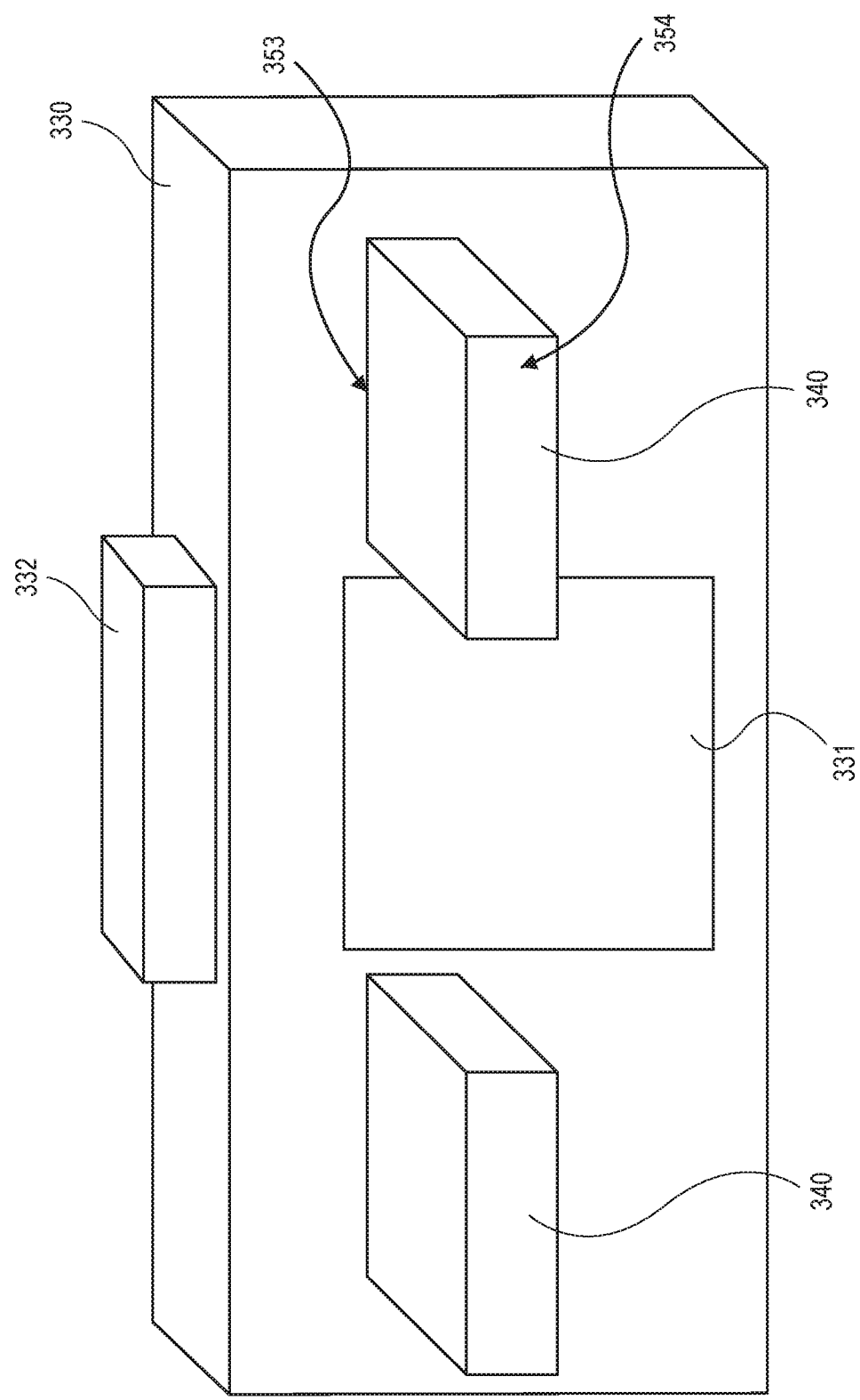
FIG. 3 is a perspective view illustration of a ULTM and linear transfer loadlocks, in accordance with an embodiment of the present disclosure.

Referring now to FIG. 3, a perspective illustration of a ULTM 330 and linear transfer loadlocks 340 is shown, in accordance with an embodiment of the present disclosure. In an embodiment, the linear transfer loadlocks 340 are attached to ULTM 330. For example, a first end 353 of the linear transfer loadlocks 340 are coupled to the ULTM 330. The opposite second ends 354 of the linear transfer loadlocks 340 are attached to the processing chambers (not shown).

In an embodiment, an access panel 331 may be provided along a surface of the ULTM 330. The access panel 331 may provide power and/or data connections for controlling the ULTM 330. In an embodiment, the access panel 331 may also provide access to the interior of the ULTM 330 to allow for service of the components within the ULTM 330. In an embodiment, the access panel 331 is provided between the linear transfer loadlocks 340. In other embodiments, the access panel 331 may be provided on an end of the ULTM 330 or adjacent to the storage units (not shown) on the opposite side of the ULTM 330 from the linear transfer loadlocks 340. In an embodiment, a computing device 332 for controlling the ULTM 330 and/or the linear transfer loadlocks 340 may be provided above a top surface of the ULTM 330. However, it is to be appreciated that the computing device 332 for controlling the ULTM 330 may be provided at any location, including remote from the processing tool.

Figure 4B:
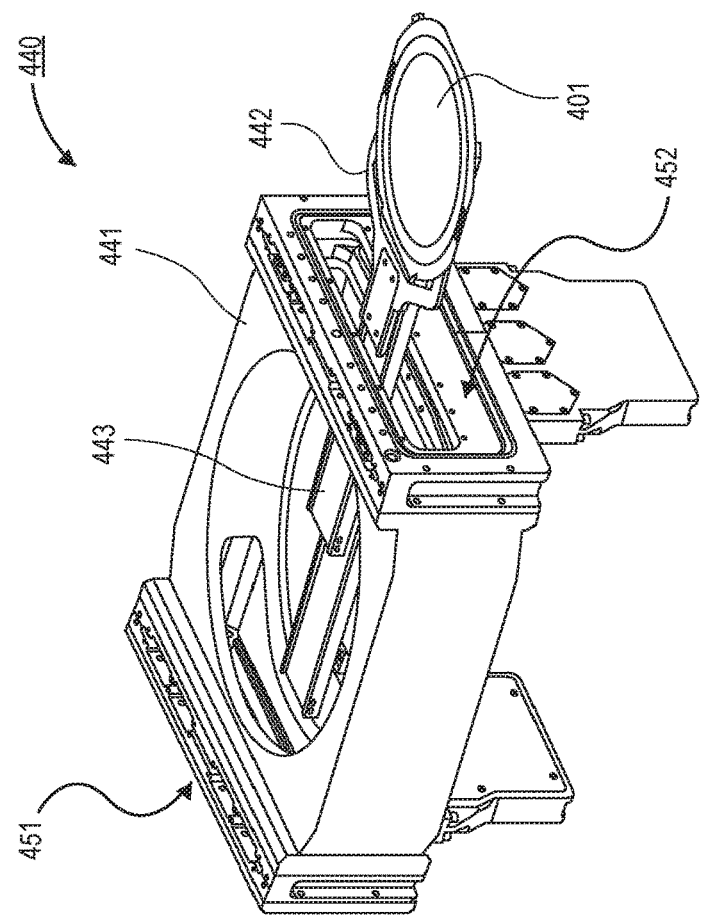
FIG. 4B is a perspective view illustration of a linear transfer loadlock with an extended linear transfer mechanism, in accordance with an additional embodiment of the present disclosure.
Figure 4A:
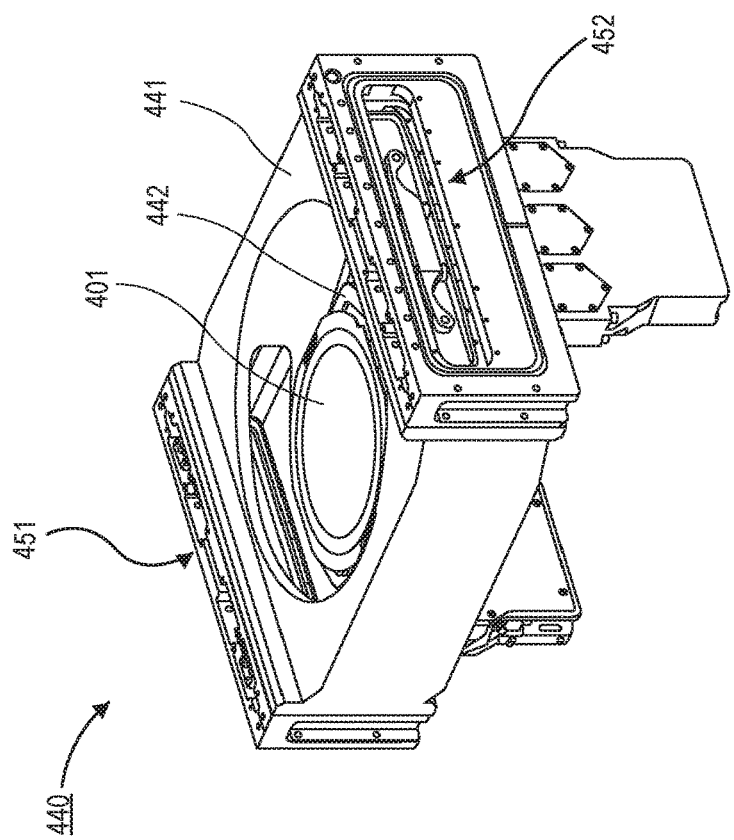
FIG. 4A is a perspective view illustration of a linear transfer loadlock with a substrate enclosed in the linear transfer loadlock, in accordance with an embodiment of the present disclosure.

Referring now to FIGS. 4A and 4B, perspective view illustrations of a linear transfer loadlock 440 are shown, in accordance with an embodiment of the present disclosure. FIG. 4A illustrates the linear transfer loadlock 440 in a retracted position with a substrate 401 inside, and FIG. 4B illustrates the linear transfer loadlock 440 in an extended position for transferring the substrate 401 into a processing chamber (not shown).

In an embodiment, the linear transfer loadlock 440 comprises a housing 441 for surrounding the internal features of the linear transfer loadlock 440. The housing 441 may be any suitable structure capable of holding a sub-atmospheric pressure. In an embodiment, a vacuum pump (not shown) is coupled to the housing 441 in order to provide a vacuum within the housing 441. In the illustrated embodiment, a cutout is shown on the top surface of the housing 441. The cutout may be sealed by a window or omitted.

In an embodiment, the linear transfer loadlock 440 comprises a first door 451 (not visible) and a second door 452. The first door 451 attaches to the ULTM and the second door 452 attaches to the processing chamber. In an embodiment, the first door 451 is opened and a substrate 401 is inserted into the housing 441 by a robot in the ULTM. The substrate 401 may be placed on an end effector or blade 442. The end effector or blade 442 may be configured to receive substrates of any given form factor. In an embodiment, the end effector or blade 442 is configured to receive a substrate 401 that is supported on a carrier (e.g., a tape frame).

After the substrate 401 is inserted into the housing 441, the first door 451 is closed. The vacuum pump may then be activated to bring the internal pressure of the housing 441 down to a desired vacuum pressure. The vacuum pressure may substantially match the pressure of the processing chamber that is attached to the linear transfer loadlock 440. In an embodiment, the linear transfer loadlock 440 may be capable of supporting vacuum pressures of approximately 50 mTorr or lower.

After the desired vacuum pressure is reached inside the housing 441, the second door 452 is opened. The second door 452 opens to the interior of the processing chamber (not shown). With the second door 452 open, the end effector or blade 442 is extended out from the housing 441, as shown in FIG. 4B. The end effector or blade 442 is extended by a linear actuator 443. The linear actuator 442 may have mechanical components that minimize the generation of particles. In some embodiments, portions of the linear actuator 442 are surrounded by a cover (not shown) to further limit the spread of particles in the housing 441.

The substrate 401 is then placed on a support in the processing chamber, and the end effector or blade 442 is withdrawn back into the housing 441. The second door 452 is then closed, and the substrate 401 can be processed by the processing chamber. After the substrate processing is completed, the second door 452 is opened, and the end effector or blade 442 is inserted into the processing tool to retrieve the substrate 401. The end effector or blade 442 is then retracted back into the housing 441, and the second door 452 is closed. The vacuum may be released, and the first door 451 is opened to allow the ULTM robot to retrieve the substrate 401 from the housing 441.

In the illustrated embodiments, the linear transfer loadlock is described and illustrated for use with a tool for hybrid dicing applications. However, it is to be appreciated that embodiments are not limited to using linear transfer loadlocks in such applications. For example, linear transfer loadlocks may be utilized in other applications that typically rely on a cluster tool comprising a mainframe. Similar to the embodiments described above, the mainframe is replaced by a plurality of linear transfer loadlocks (i.e., one for each processing chamber).

Figure 5:
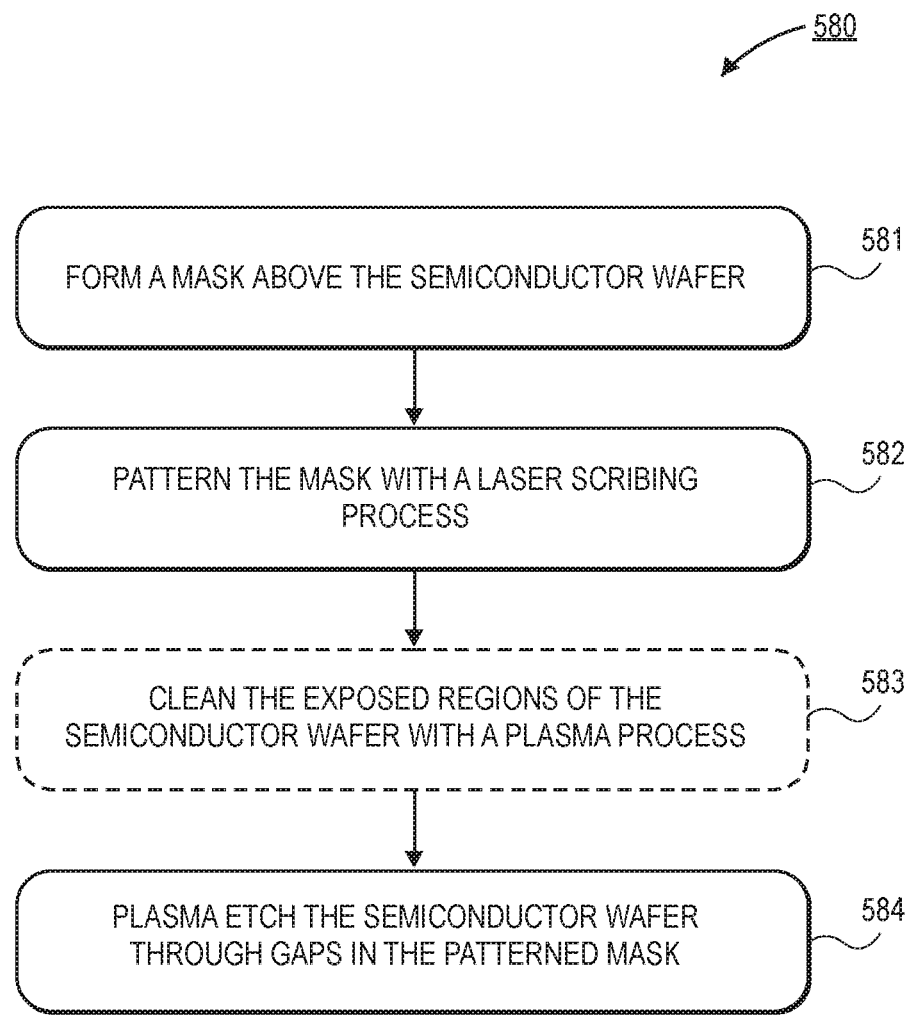
FIG. 5 is a flowchart depicting a process for laser and plasma dicing wafers or substrates, in accordance with an embodiment of the present disclosure.
Figure 6A:
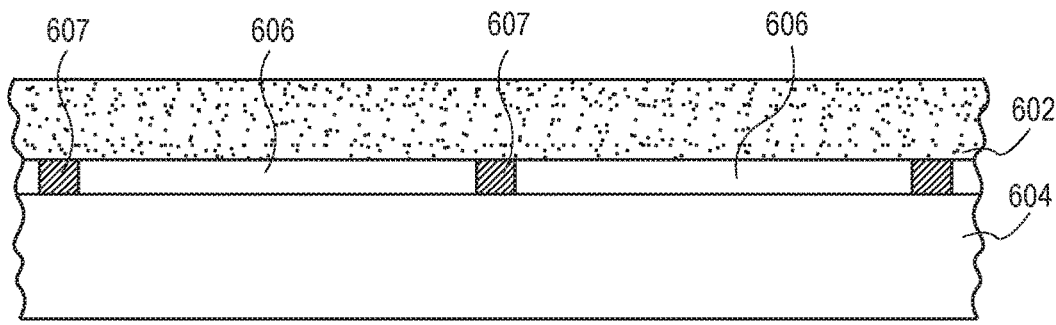
FIG. 6A illustrates a cross-sectional view of a semiconductor wafer including a plurality of integrated circuits during performing of a method of dicing the semiconductor wafer, corresponding to operation 581 of the flowchart of FIG. 5, in accordance with an embodiment of the present disclosure.
Figure 6B:
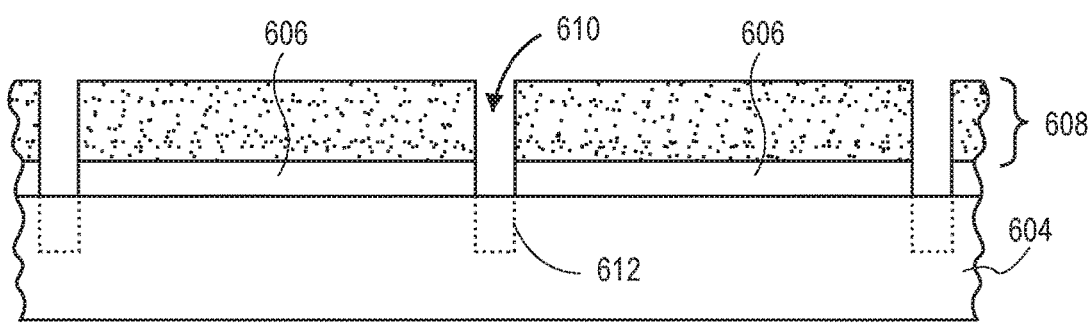
FIG. 6B illustrates a cross-sectional view of a semiconductor wafer including a plurality of integrated circuits during performing of a method of dicing the semiconductor wafer, corresponding to operation 582 of the flowchart of FIG. 5, in accordance with an embodiment of the present disclosure.
Figure 6C:
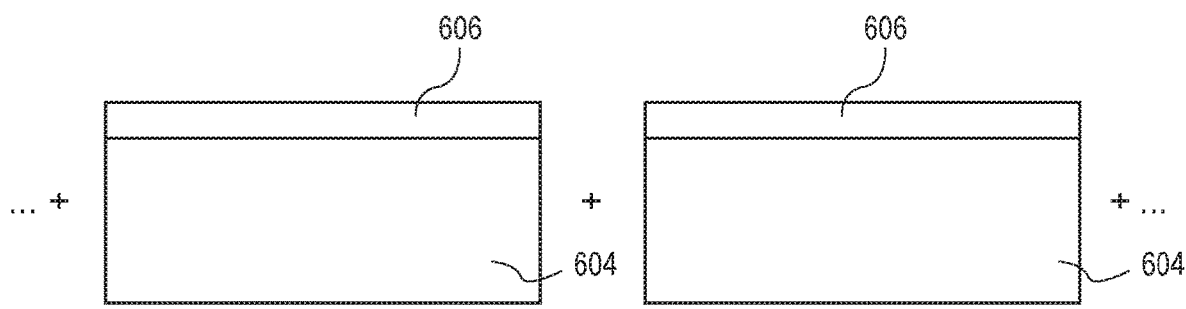
FIG. 6C illustrates a cross-sectional view of a semiconductor wafer including a plurality of integrated circuits during performing of a method of dicing the semiconductor wafer, corresponding to operation 584 of the flowchart of FIG. 5, in accordance with an embodiment of the present disclosure.

FIG. 5 is a flowchart 580 representing operations in a method of dicing a semiconductor wafer including a plurality of integrated circuits, in accordance with an embodiment of the present disclosure. FIGS. 6A-6C illustrate cross-sectional views of a semiconductor wafer including a plurality of integrated circuits during performing of a method of dicing the semiconductor wafer, corresponding to operations of flowchart 580, in accordance with an embodiment of the present disclosure.

Referring to operation 581 of flowchart 580, and corresponding FIG. 6A, a mask 602 is formed above a semiconductor wafer or substrate 604. The mask 602 is composed of a layer covering and protecting integrated circuits 606 formed on the surface of semiconductor wafer 604. The mask 602 also covers intervening streets 607 formed between each of the integrated circuits 606.

In accordance with an embodiment of the present disclosure, forming the mask 602 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultraviolet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 602 involves forming a layer deposited in a plasma deposition process. For example, in one such embodiment, the mask 602 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 602 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 602 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a III-V material such as, e.g., a III-V material substrate used in the fabrication of light emitting diodes (LEDs).

In an embodiment, semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

Referring to operation 582 of flowchart 580, and corresponding FIG. 6B, the mask 602 is patterned with a laser beam laser scribing process to provide a patterned mask 608 with gaps 610, exposing regions of the semiconductor wafer or substrate 604 between the integrated circuits 606. As such, the laser scribing process is used to remove the material of the streets 607 originally formed between the integrated circuits 606. In accordance with an embodiment of the present disclosure, patterning the mask 602 with the actively-focused laser beam laser scribing process includes forming trenches 612 partially into the regions of the semiconductor wafer 604 between the integrated circuits 606, as depicted in FIG. 6B.

In case that the laser beam is a femtosecond-based laser beam, in an embodiment, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns or between 10-15 microns.

In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth.

It is to be appreciated that the dicing or singulation process could be stopped after the above described laser scribing in a case that the laser scribing is used to pattern the mask as well as to scribe fully through the wafer or substrate in order to singulate the dies. Accordingly, further singulation processing would not be required in such a case. However, the following embodiments may be considered in cases where laser scribing alone is not implemented for total singulation.

Referring now to optional operation 583 of flowchart 580, an intermediate post mask-opening cleaning operation is performed. In an embodiment, the post mask-opening cleaning operation is a plasma-based cleaning process. In a first example, as described below, the plasma-based cleaning process is reactive to the regions of the substrate 604 exposed by the gaps 610. In the case of a reactive plasma-based cleaning process, the cleaning process itself may form or extend trenches 612 in the substrate 604 since the reactive plasma-based cleaning operation is at least somewhat of an etchant for the substrate 604. In a second, different, example, as is also described below, the plasma-based cleaning process is non-reactive to the regions of the substrate 604 exposed by the gaps 610.

In accordance with a first embodiment, the plasma-based cleaning process is reactive to exposed regions of the substrate 604 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases $Ar+SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions. The approach may be suitable for photoresist or plasma-deposited Teflon masks 602, where breakthrough treatment leads to fairly uniform mask thickness reduction and a gentle Si etch. Such a breakthrough etch process, however, may not be best suited for water soluble mask materials.

In accordance with a second embodiment, the plasma-based cleaning process is non-reactive to exposed regions of the substrate 604 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings. The approach may be suitable for water-soluble masks or for thinner plasma-deposited Teflon 602. In another such embodiment, separate mask condensation and scribed trench cleaning operations are used, e.g., an Ar or non-reactive gas (or the mix) highly-biased plasma treatment for mask condensation is first performed, and then an $Ar+SF_6$ plasma cleaning of a laser scribed trench is performed. This embodiment may be suitable for cases where Ar-cleaning is not sufficient for trench cleaning due to too thick of a mask material. Cleaning efficiency is improved for thinner masks, but mask etch rate is much lower, with almost no consumption in a subsequent deep silicon etch process. In yet another such embodiment, three-operation cleaning is performed: (a) Ar or non-reactive gas (or the mix) highly-biased plasma treatment for mask condensation, (b) $Ar+SF_6$ highly-biased plasma cleaning of laser scribed trenches, and (c) Ar or non-reactive gas (or the mix) highly-biased plasma treatment for mask condensation. In accordance with another embodiment of the present disclosure, a plasma cleaning operation involves first use of a reactive plasma cleaning treatment, such as described above in the first aspect of operation 583. The reactive plasma cleaning treatment is then followed by a non-reactive plasma cleaning treatment such as described in association with the second aspect of operation 583.

Referring to operation 584 of flowchart 580, and corresponding FIG. 6C, the semiconductor wafer 604 is etched through the gaps 610 in the patterned mask 608 to singulate the integrated circuits 606. In accordance with an embodiment of the present disclosure, etching the semiconductor wafer 604 includes ultimately etching entirely through semiconductor wafer 604, as depicted in FIG. 6C, by etching the trenches 612 initially formed with the actively-focused laser beam laser scribing process.

In an embodiment, patterning the mask with the laser scribing process involves forming trenches in the regions of the semiconductor wafer between the integrated circuits, and plasma etching the semiconductor wafer involves extending the trenches to form corresponding trench extensions. In one such embodiment, each of the trenches has a width, and each of the corresponding trench extensions has the width.

In accordance with an embodiment of the present disclosure, the resulting roughness of mask opening from laser scribing can impact die sidewall quality resulting from the subsequent formation of a plasma etched trench. Lithographically opened masks often have smooth profiles, leading to smooth corresponding sidewalls of a plasma etched trench. By contrast, a conventional laser opened mask can have a very rough profile along a scribing direction if improper laser process parameters are selected (such as spot overlap, leading to rough sidewall of plasma etched trench horizontally). Although the surface roughness can be smoothened by additional plasma processes, there is a cost and throughput hit to remedying such issues. Accordingly, embodiments described herein may be advantageous in providing a smoother scribing process and/or more reliable trench formation process from the laser scribing portion of the singulation process.

In an embodiment, etching the semiconductor wafer 604 includes using a plasma etching process. In one embodiment, a through-silicon via type etch process is used. For example, in a specific embodiment, the etch rate of the material of semiconductor wafer 604 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the mask layer 608 is removed after the singulation process, as depicted in FIG. 6C. In another embodiment, the plasma etching operation described in association with FIG. 6C employs a conventional Bosch-type dep/etch/dep process to etch through the substrate 604. Generally, a Bosch-type process consists of three sub-operations: deposition, a directional bombardment etch, and isotropic chemical etch which is run through many iterations (cycles) until silicon is etched through.

Accordingly, referring again to flowchart 580 and FIGS. 6A-6C, wafer dicing may be preformed by initial ablation using a laser beam laser scribing process to ablate through a mask layer, through wafer streets (including metallization), and partially into a silicon substrate. Die singulation may then be completed by subsequent through-silicon deep plasma etching Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process tool 200 described in association with FIGS. 2A-2C. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
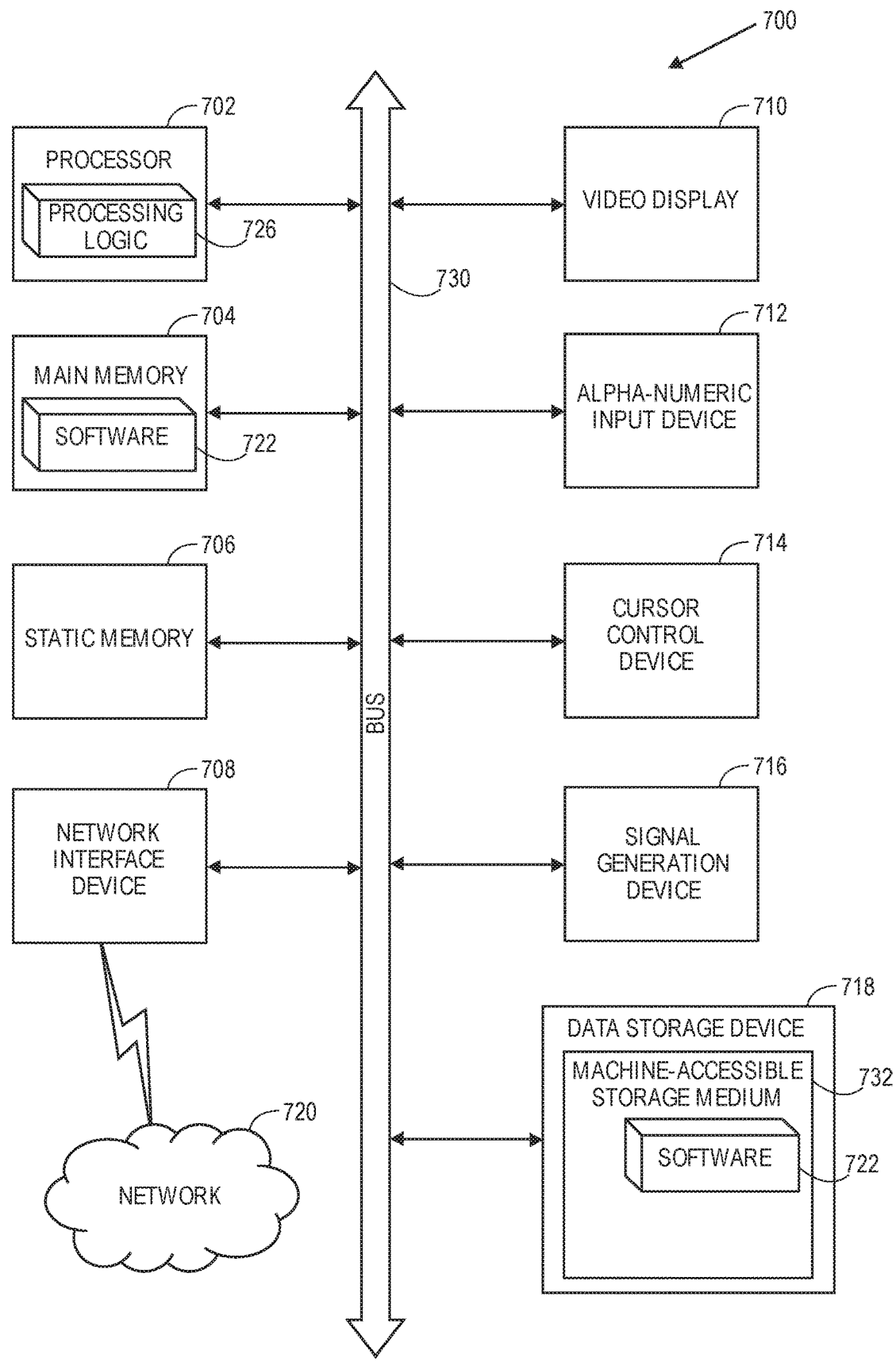
FIG. 7 illustrates a block diagram of an exemplary computer system, in accordance with an embodiment of the present disclosure.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), MRAM, etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of dicing a semiconductor wafer having a plurality of integrated circuits. The method includes forming a mask above the semiconductor wafer, the mask composed of a layer covering and protecting the integrated circuits. The mask is then patterned with a laser beam laser scribing process to provide a patterned mask with gaps, exposing regions of the semiconductor wafer between the integrated circuits. The semiconductor wafer is then plasma etched through the gaps in the patterned mask to singulate the integrated circuits.

Thus, hybrid wafer dicing approaches using a laser beam and plasma etch process have been disclosed.

What is claimed is:

1. A semiconductor processing tool for implementing hybrid laser and plasma dicing of a substrate, comprising:
   a transfer module, wherein the transfer module comprises a track robot for handling the substrate;
   a first loadlock attached to the transfer module, wherein the first loadlock comprises a first linear transfer system for handling the substrate;
   a processing chamber attached to the first loadlock, wherein the first linear transfer system of the first loadlock is configured to insert and remove the substrate from the processing chamber; and
   a second loadlock attached to the transfer module, wherein the second loadlock comprises a second linear transfer system for handling the substrate.

2. The semiconductor processing tool of claim 1, wherein the track robot is configured to remove the substrate from a cassette and transfer the substrate to the first loadlock.

3. The semiconductor processing tool of claim 1, wherein the processing chamber is a plasma etching chamber.

4. The semiconductor processing tool of claim 3, further comprising:
   a laser module attached to the transfer module, wherein the track robot is configured to transfer the substrate from the laser module to the first loadlock.

5. The semiconductor processing tool of claim 1, wherein the substrate is attached to a tape frame.

6. The semiconductor processing tool of claim 1, wherein the first linear transfer system is at least partially surrounded by a cover.

7. The semiconductor processing tool of claim 1, wherein the first loadlock is capable of supporting a vacuum pressure that is approximately 50 mTorr or lower.

8. The semiconductor processing tool of claim 1, further comprising:
   a second processing chamber attached to the second loadlock.

9. The semiconductor processing tool of claim 8, wherein the processing chamber and the second processing chamber are attached to the same side of the transfer module.

10. The semiconductor processing tool of claim 8, wherein the processing chamber and the second processing chamber are attached to different sides of the transfer module.

11. A plasma laser dicing tool for dicing of a substrate, comprising:
    a transfer module, wherein the transfer module comprises a track robot for handling the substrate;
    a laser module attached to the transfer module, wherein the track robot is configured to insert and remove the substrate from the laser module;
    a first loadlock attached to the transfer module, wherein the first loadlock comprises a first linear transfer system for handling the substrate;
    a first processing chamber attached to the first loadlock, wherein the first linear transfer system of the first loadlock is configured to insert and remove the substrate from the first processing chamber;
    a second loadlock attached to the transfer module, wherein the second loadlock comprises a second linear transfer system for handling the substrate; and
    a second processing chamber attached to the second loadlock, wherein the second linear transfer system of the second loadlock is configured to insert and remove the substrate from the second processing chamber.

12. The plasma laser dicing tool of claim 11, wherein the first processing chamber and the second processing chamber are plasma chambers.

13. The plasma laser dicing tool of claim 11, wherein the first processing chamber and the second processing chamber are adjacent to each other.

14. The plasma laser dicing tool of claim 11, wherein the first loadlock and the second loadlock each comprise:
    an enclosure, wherein a first door is on a first side of the enclosure and interfaces with the transfer module, and a second door is on a second side of the enclosure that is opposite from the first side and interfaces with the first processing chamber or the second processing chamber;
    a linear actuator in the enclosure, wherein the linear actuator extends out the second door when extended; and
    an end effector attached to the linear actuator.

15. The plasma laser dicing tool of claim 11, wherein the track robot is configured to remove the substrate from a cassette and transfer the substrate to the loadlock.

\* \* \* \* \*